US012665604B2

(12) United States Patent　(10) Patent No.:　US 12,665,604 B2
Gambus et al.　(45) Date of Patent:　Jun. 23, 2026

(54) SELF-SYNCHRONIZED SCHEME FOR ENFORCING PHASE COHERENCY IN A SYSTEM WITH MULTIPLE FREQUENCY DIVIDERS

(71) Applicant: NXP B.V., Eindhoven (NL)

(72) Inventors: Laurent Gambus, Cuverville (FR); Nicolas Constantinidis, Creserons (FR); Rafael Luciano Radin, Caen (FR); Philippe Christian Belin, Mezidon vallee d'auge (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/923,983

(22) Filed: Oct. 23, 2024

(65) Prior Publication Data

US 2026/0113046 A1　Apr. 23, 2026

(51) Int. Cl.
H03L 7/199　(2006.01)
G06F 1/12　(2006.01)
H03L 7/187　(2006.01)

(52) U.S. Cl.
CPC ................ H03L 7/187 (2013.01); G06F 1/12 (2013.01); H03L 7/199 (2013.01); *H03L 2207/18* (2013.01)

(58) Field of Classification Search
CPC ..... G06F 1/06; G06F 1/08; G06F 1/10; G06F 1/12; H03L 7/16; H03L 7/18; H03L 7/1803; H03L 7/197; H03L 7/199; H03L 2207/18
See application file for complete search history.

(56) References Cited

U.S. PATENT DOCUMENTS

| | | | | |
|---|---|---|---|---|
| 5,278,814 | A * | 1/1994 | Deguchi | G11B 20/1403 369/53.29 |
| 5,977,837 | A * | 11/1999 | Byrn | H03L 7/095 327/295 |
| 6,100,767 | A * | 8/2000 | Sumi | H03L 7/087 331/25 |
| 6,463,013 | B1 * | 10/2002 | Liu | H03L 7/23 327/295 |
| 7,236,040 | B2 * | 6/2007 | Chan | G06F 1/04 327/295 |
| 7,463,710 | B2 | 12/2008 | Walsh et al. | |
| 8,664,990 | B2 | 3/2014 | Turner et al. | |
| 11,469,765 | B1 * | 10/2022 | Brady | G06F 1/12 |

(Continued)

FOREIGN PATENT DOCUMENTS

| | | |
|---|---|---|
| CN | 107925411 A | 4/2018 |
| JP | S60113589 A | 6/1985 |

*Primary Examiner* — Levi Gannon

(57) ABSTRACT

A method for enforcing phase coherency in a self-synchronizing system with multiple frequency dividers includes synchronizing an asynchronous reset to a first output of a first divider to generate a global reset, wherein the first output is generated by dividing a Voltage Controlled Oscillator (VCO) output of a VCO into a plurality of phases including a common phase. The global reset is applied to each of at least a second divider and a third divider to temporally align the first output during the common phase with a second output of the second divider and a third output of the third divider, wherein the second output and the third output are generated by dividing the VCO output by the respective second divider and the third divider, and applying the global reset enables a respective state transition on the second output and the third output beginning during the common phase.

21 Claims, 8 Drawing Sheets

(56)　　　　　　References Cited

U.S. PATENT DOCUMENTS

| | | | |
|---|---|---|---|
| 11,652,488 B2 | 5/2023 | Turner et al. | |
| 2004/0027181 A1* | 2/2004 | Watanabe | H03L 7/07 |
| | | | 327/156 |
| 2005/0184773 A1* | 8/2005 | Boyko | H03L 7/18 |
| | | | 327/156 |
| 2016/0301419 A1* | 10/2016 | Schram | H03B 19/00 |
| 2017/0134031 A1* | 5/2017 | Ezell | G06F 1/12 |
| 2023/0189197 A1* | 6/2023 | Srinivasan | H04L 7/041 |
| | | | 455/456.1 |
| 2025/0007525 A1* | 1/2025 | Zhu | H03K 5/13 |

* cited by examiner

302

Synchronizing An
Asynchronous Reset To A
Clock Output Of A Clock
Source Divider To Generate
A Global Reset

300

304

Applying The Global Reset
To A Receiver And
Transmitter Clock Source
Divider To Enable A
Respective State Transition
During A Common Phase
Wherein The Clock Output
Is Generated

SELF-SYNCHRONIZED SCHEME FOR ENFORCING PHASE COHERENCY IN A SYSTEM WITH MULTIPLE FREQUENCY DIVIDERS

FIELD

This disclosure relates generally to electronic circuits, and more specifically to ensuring phase coherency between electronic signals generated by multiple frequency divisions of a clock source.

BACKGROUND

Systems that generate multiple clocks from a single clock source often require phase coherency and predictability between the generated clocks. In particular, a system function that relies upon the interdependence of several of the generated clocks with different frequencies or phases may require a predictable phase relationship between the clocks, and often a phase synchronization.

Variations in how the multiple clocks may be generated (e.g., with different divider architectures), as well as variations in manufacturing conditions and environmental conditions, further complicate maintaining the multiple generated clocks in a predictable and coherent phase relationship. Furthermore, traditional approaches to aligning clock phases using a "pulse swallow up" technique, commonly used in fractional N-frequency dividers, impose an area overhead on each generated clock.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for the self-synchronization of a system having multiple frequency dividers to generate multiple clocks, each with a predictable and coherent phase with respect to each other. Phase coherency is achieved with systems having different divider topologies as well mismatching between the dividers due to manufacturing and environmental variations. Specifically, the self-synchronizing system uses a clock domain of one frequency divider to enable the start of frequency division on the remaining dividers, where each of the remaining dividers begins state transitions from a controlled state. Phase coherency between generated clocks may be required for a number of applications. In one embodiment, phase coherency is used to enable wireless localization in a Bluetooth Low Energy (BLE) product, where transmit and receive local oscillator signals need to be predictable and coherent with respect to a Phase-Locked Loop (PLL) local oscillator signal.

Figure 1:
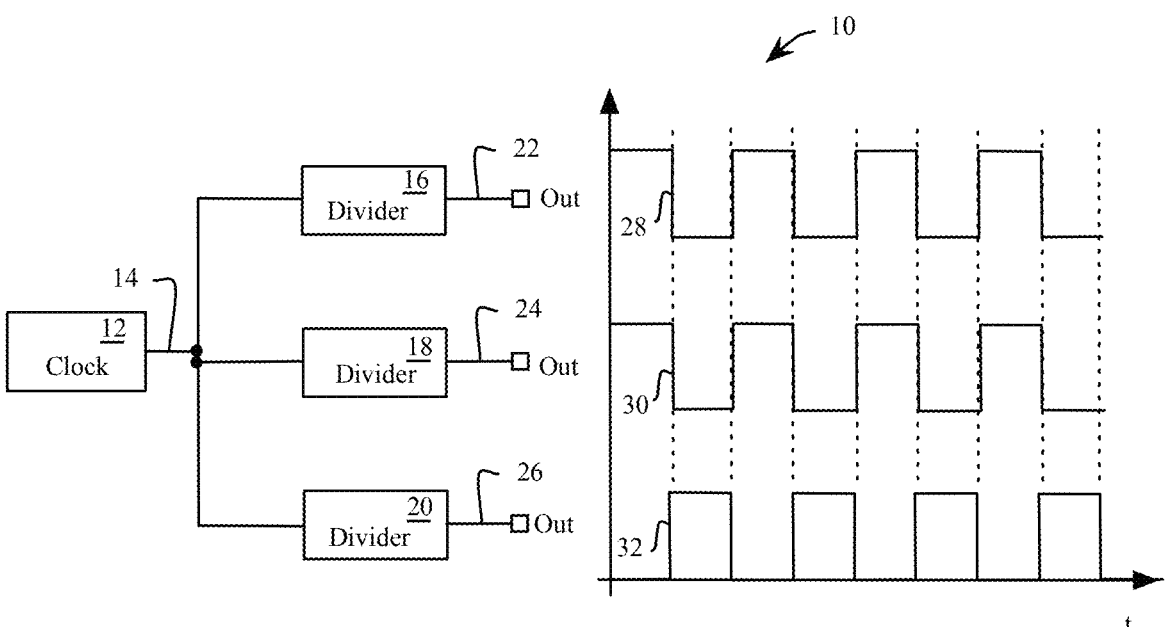
FIG. 1 is a schematic view of an example of a system with multiple frequency dividers.

FIG. 1 shows an example of a system 10 including a clock 12. The clock 12 generates a clock output 14, which is divided by dividers 16, 18 and 20 to generate respective outputs 22, 24 and 26. Due to the different nature of the three different dividers, without a synchronization scheme, the frequency dividers produce outputs 22, 24 and 26 with arbitrary phase relationship between each other, as shown in the example of FIG. 1. In this example, the outputs 22 and 24 may include respective initial state transitions 28 and 30, both transitioning from a high state to a low state. Without synchronization between the dividers 16, 18 and 20, the divider 20 may include an initial state transition 32 that transitions from a low state to a high state, out of phase with the initial state transitions 28 and 30.

Figure 2:
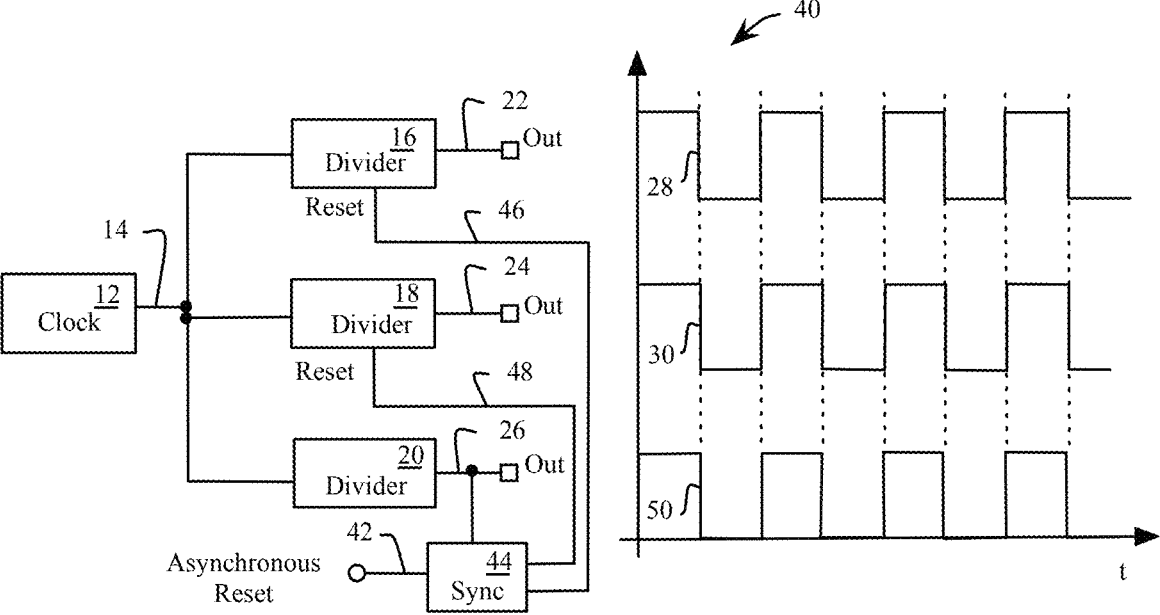
FIG. 2 is a schematic view of a system with multiple frequency dividers with self-synchronized phase coherency, in accordance with an embodiment of the present disclosure.

FIG. 2 shows an embodiment 40 of a system providing phase synchronization between the outputs 22, 24 and 26. An asynchronous reset 42 is synchronized to the output 26 by a synchronizer 44 to generate global resets 46 and 48 for the respective dividers 16 and 18. The global resets 46 and 48 keep the outputs 22 and 24 in a fixed (e.g., grounded) state, thereby preventing state transitions on the outputs 22 and 24. Upon releasing the global resets 46 and 48, coincident with a state transition on the output 26 of the divider 20, the outputs 22, 24 and 26 will transition with phase alignment to each other. Accordingly, the initial state transitions 28 and 30 of respective dividers 16 and 18 will match (e.g., are in phase with) the initial state transition 50 of the divider 20.

Figure 3:
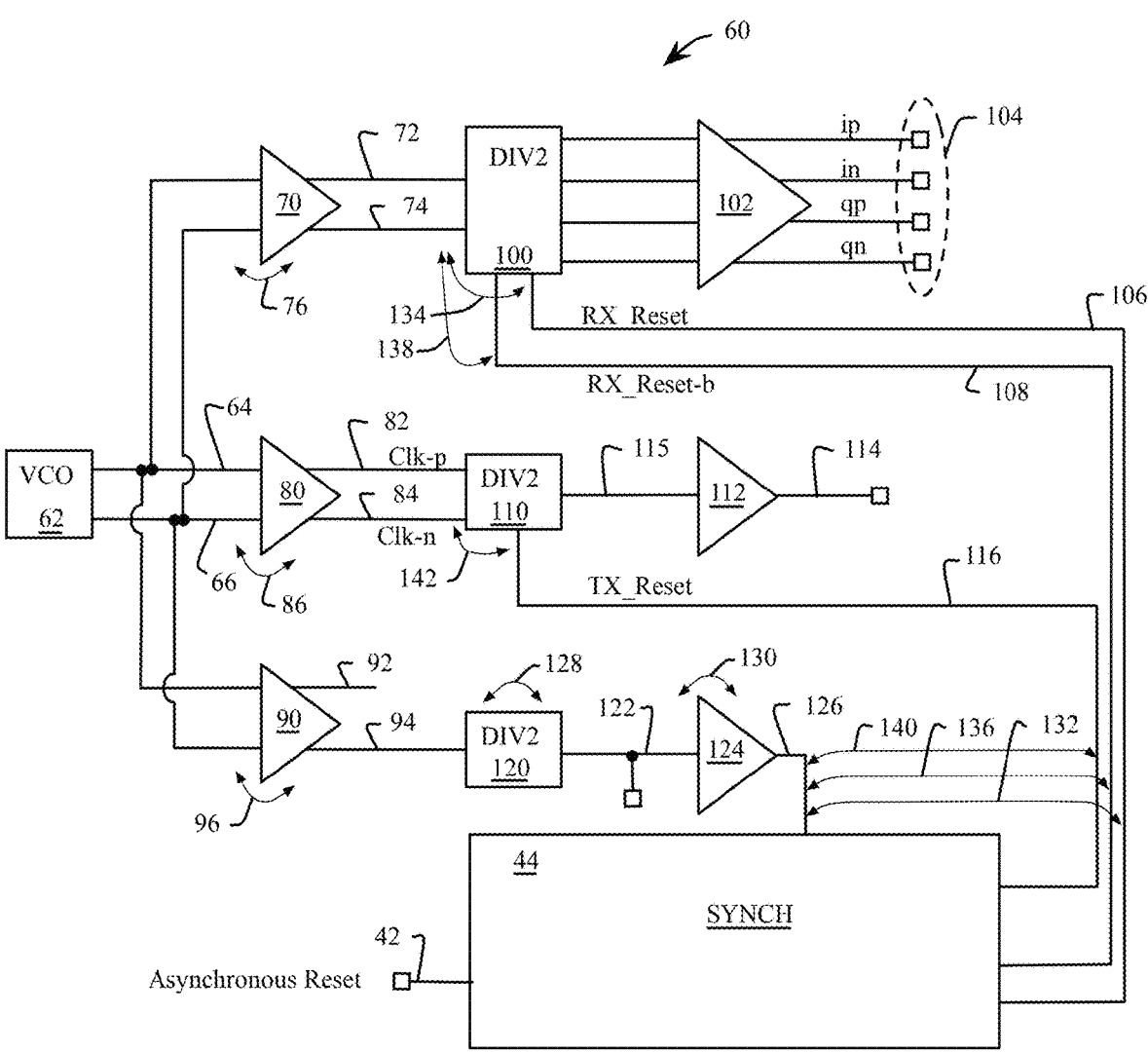
FIG. 3 is a schematic view showing further detail of the system of FIG. 2, in accordance with an embodiment of the present disclosure.

FIG. 3 shows further details of the system of FIG. 2 with one embodiment 60 of a self-synchronizing system. The embodiment 60 shows one implementation of a self-synchronized scheme for enforcing phase coherency with a combination of single-ended and differential signaling, as well as three dividers. It should be appreciated that the teachings of this disclosure may also apply to other embodiments with a different combination of signalling, including single-ended, differential, quadrature or any combination thereof. Furthermore, other embodiments may include one or more dividers in addition to the divider 120.

In FIG. 3, one or more embodiments of the clock source may include a Voltage Controlled Oscillator (VCO) 62. The VCO 62 may generate a VCO output, shown in FIG. 3 with different output 64 and 66. The embodiment 60 shows various devices implemented with differential inputs or outputs. However, in one or more embodiments, single ended signaling may be used. In the embodiment 60, the differential outputs 64 and 66 may be buffered by a buffer 70, providing differential outputs 72 and 74, and having a delay 76 from the input 66 to the output 74 of the buffer 70. Similarly, the differential outputs 64 and 66 may be buffered by a buffer 80, providing differential outputs 82 and 84, and having a delay 86 from the input 66 to the output 84 of the buffer 80. Additionally, the differential outputs 64 and 66 may be buffered by a buffer 90, providing differential outputs 92 and 94, and having a delay 96 from the input 66 to the output 94 of the buffer 90.

The different outputs 72 and 74 provide a clock frequency, which is divided by a divider 100 and buffered by a buffer 102, to provide outputs 104 used by a receiver path of a localization device. The divider 100 may be reset by global resets 106 and 108, generated by the synchronizer 44. The different outputs 82 and 84 provide a clock frequency, which is divided by a divider 110 to provide an output 115. The output 115 may be buffered by a buffer 112, to provide an output 114 used by a transmitter path of a localization device. The divider 110 may be reset by a global reset 116, generated by the synchronizer 44. The output 94 may provide a clock frequency, which is divided by a divider 120 to provide an output 122. The output 122 may be used as a feedback signal for a PLL used to control the VCO. The output 122 may also be buffered by a buffer 124, to provide an output 126 used by the synchronizer 44.

The divider 120 may have a delay 128 from the input 94 to the output 122. The buffer 124 may have a delay 130 from the input 122 to the output 126. The output 126 of the buffer 124 may have a delay 132 to the global reset 106 of the divider 100. The divider 100 may have a delay 134 from the input 74 to the global reset 106. The output 126 of the buffer 124 may have a delay 136 to the global reset 108. The divider 100 may have a delay 138 from the input 74 to the global reset 108. The divider 100 is implemented with a differential reset using global resets 106 and 108 as part of a receiver path. In other embodiments, the divider 100 may be implemented with a single ended reset. The output 126 of the buffer 124 may have a delay 140 to the global reset 116 of the divider 110. The divider 110 may have a delay 142 from the input 84 to the global reset 116.

Figure 4:
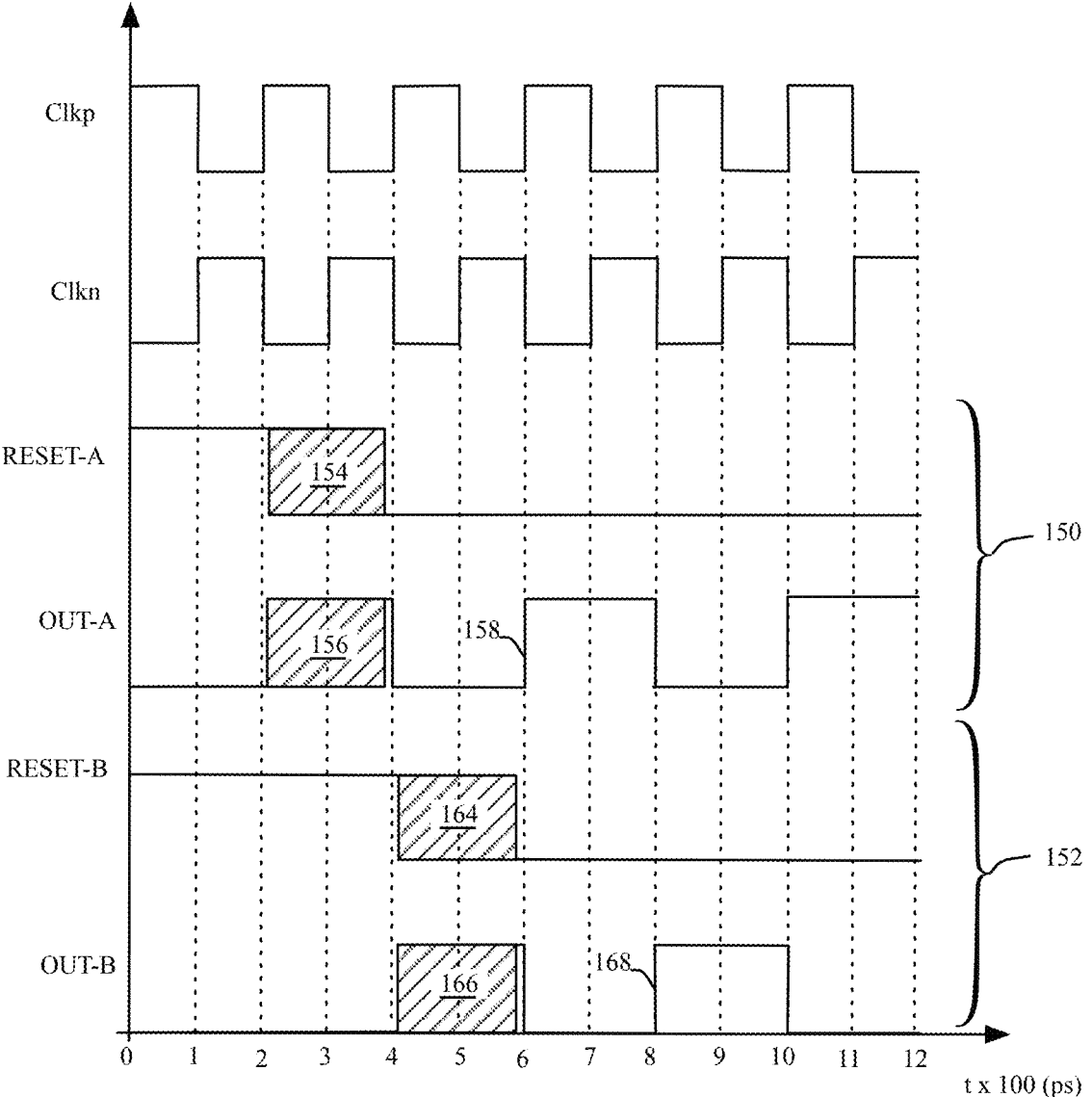
FIG. 4 is graphical view of a reset and release method used with the embodiment of FIG. 2, in accordance with an embodiment of the present disclosure.

FIG. 4 shows a graphical view of a reset and release method used with FIG. 2 and FIG. 3. With continued reference to FIG. 3 and FIG. 4, a self-synchronizing system may use a pair of differential clocks Clkp and Clkn (for example, clocks 82 and 84 of FIG. 3). Depending upon when a respective reset of the dividers 100 and 110 is released, either a phase condition A 150 or a phase condition B 152 may result for one or both of the dividers 100 and 110.

Releasing a reset within the window 154 may result in state transitions beginning in the window 156 and subsequently at 158. Similarly, releasing a reset within the window 164 may result in state transitions beginning in the window 166 and subsequently at 168. To ensure phase coherency between the three signal paths measured at the outputs 104, 114 and 126, the global resets 106, 108 and 116 should be released centered in the same window (e.g., window 154 or 164) as the state transition of the output 126. Furthermore, the release of the global resets 106, 108 and 116 should be centered for nominal conditions, so that the release remains in the chosen window (for example window 154) over a guaranteed range of systemic design offsets, manufacturing process variations, operating voltages, operating temperatures and any environmental differences between the three dividers 100, 110 and 120 shown in FIG. 3.

In one or more embodiments, the delays of FIG. 3 may result in a cumulative offset between the global resets 106, 108 and 116, which may be balanced through a combination of modifying one or more of the device characteristics of one or more of the dividers 100, 110 and 120. For example, device characteristics may be modified by changing transistor sizes or characteristics, intrinsic delays and by adding extrinsic delay elements to narrow the timing spread of the global resets 106, 108 and 116 within the desired window 154 (or 164). In another embodiment, the buffers 70, 80 and 90 are implemented independently to provide the individual adjustment of the delays 76, 86 and 96. The adjustment allows the compensation of the different delays 134, 138 and 142 that exist from the input signals of the dividers 72, 74, 82 and 84 to the reset signals 106, 108 and 116. In another embodiment, the dividers 100, 110 and 120 may have different design implementations, thereby introducing delay differences that may be matched with the aforementioned techniques.

Figure 5:
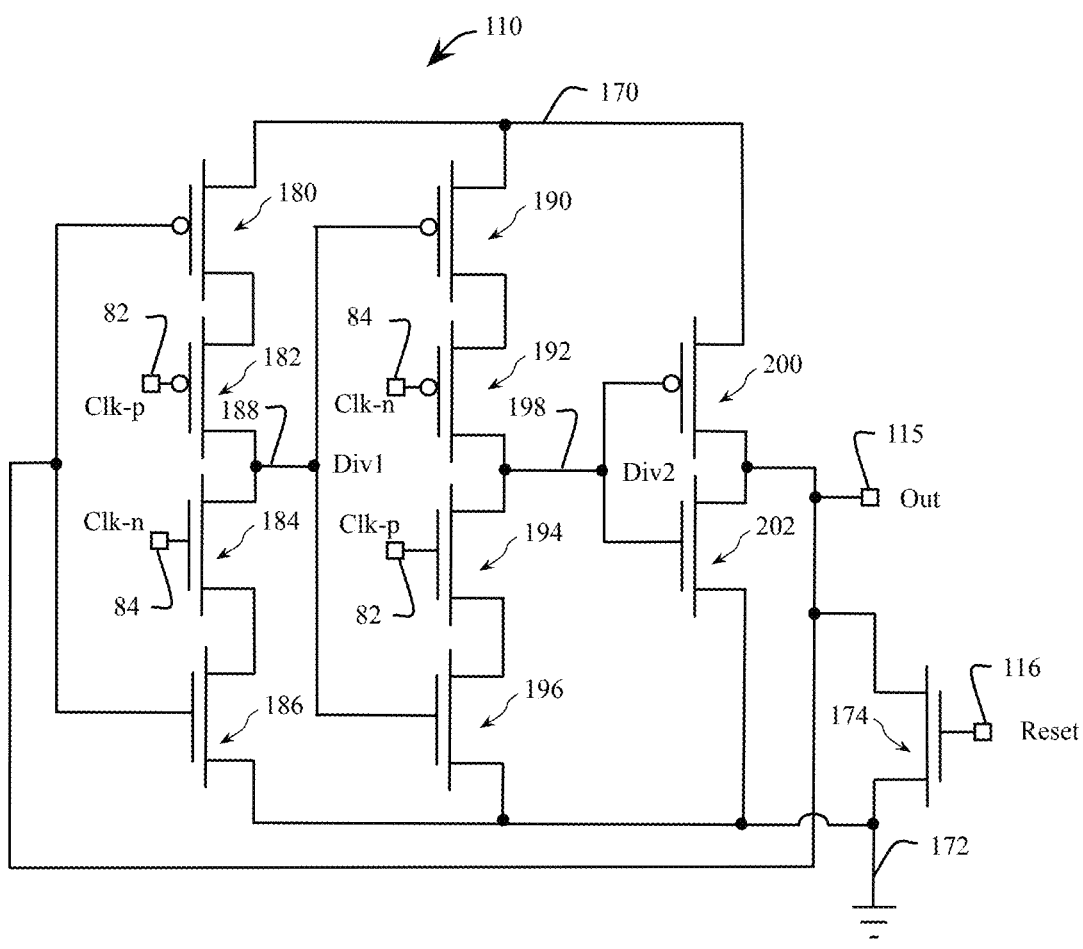
FIG. 5 is a schematic view of a divider circuit of FIG. 2, in accordance with an embodiment of the present disclosure.

FIG. 5 shows device level detail of the divider 110 of FIG. 3, in accordance with an embodiment of the present disclosure. In one or more embodiments, the divider 100 may be implemented with a similar architecture. The divider 110 may be powered between a positive supply 170 and a negative supply 172 (e.g., ground). A transistor 174 may be connected between the output 115 and ground and gated by the global reset 116. A first stage may be formed by a serial arrangement of transistors 180, 182, 184 and 186 to generate a DIV1 signal 188, in response to Clk-p 82 and Clk-n 84. A second stage may be formed by a serial arrangement of transistors 190, 192, 194 and 196 to generate a DIV2 signal 198, in response to Clk-p 82 and Clk-n 84. The DIV2 signal 198 may be buffered by a serial arrangement of transistors 200 and 202 to generate the output 115.

The output phase of the divider 110 may be controlled by the global reset 116. When the divider 110 is in a reset phase (e.g., the global reset 116 is in a high state), the output 115 may be low because the transistor 174 may overpower the transistor 200. A low level on the output 115 will force DIV1 188 to be high and DIV2 198 to be low. When the global reset 116 is released (e.g., transitioned to a low state), the output 115 will commute to a high state, thus frequency division will start in a known initial state.

Figure 6:
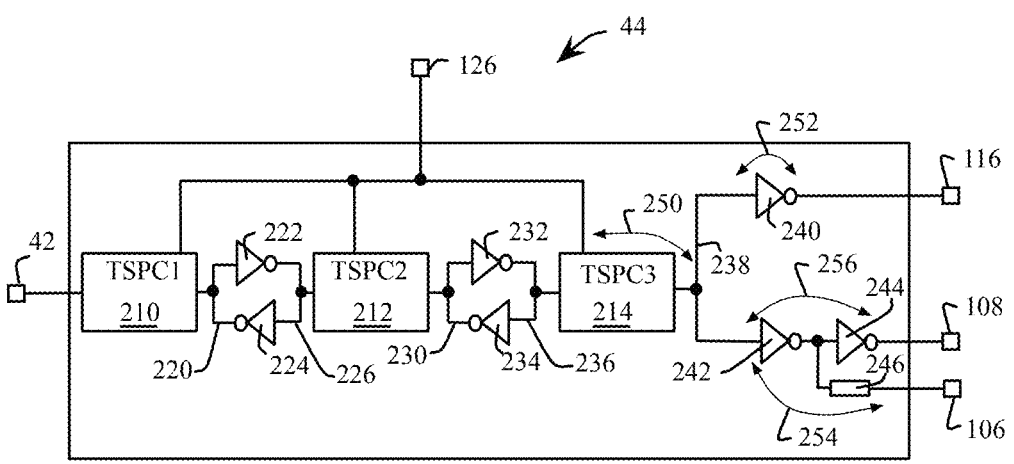
FIG. 6 is a schematic view of the SYNC circuit of FIG. 2, in accordance with an embodiment of the present disclosure.

FIG. 6 shows further detail of the synchronizer 44 of FIG. 3. In one or more embodiments, the synchronizer 44 includes three True Single-Phase Clock (TSPC) latches 210, 212 and 214 connected between the asynchronous reset 42 and the global resets 106, 108 and 116. The TSPC latches may be controlled by the output 126. The TSPC latches 210 and 212 are coupled by a pair of cross-coupled inverters 222 and 224 to increase the slew rate between signals 220 and 226 for a reduction in metastability. The TSPC latches 212 and 214 are coupled by a pair of cross-coupled inverters 232 and 234 to increase the slew rate between signals 230 and 236 for an additional reduction in metastability. In one or more embodiments, the output 238 of the TSPC latch 214 may be buffered by inverter 240 to generate the global reset 116. In one or more embodiments, the output 238 of the TSPC latch 214 may be buffered by inverters 242 and 244 to generate the global resets 106 and 108 respectively. In one or more embodiments, the delay 252 across the inverter 240, the delay 254 between the output 238 and the global reset 106 and the delay 256 between the output 238 and the global reset 108 may be compared to reduce a timing spread between the global resets 106, 108 and 116. Accordingly, a delay 246 may be introduced to optimize the centering of the global resets 106, 108 and 116 within the window 154 (or 164) of FIG. 4.

Figure 7:
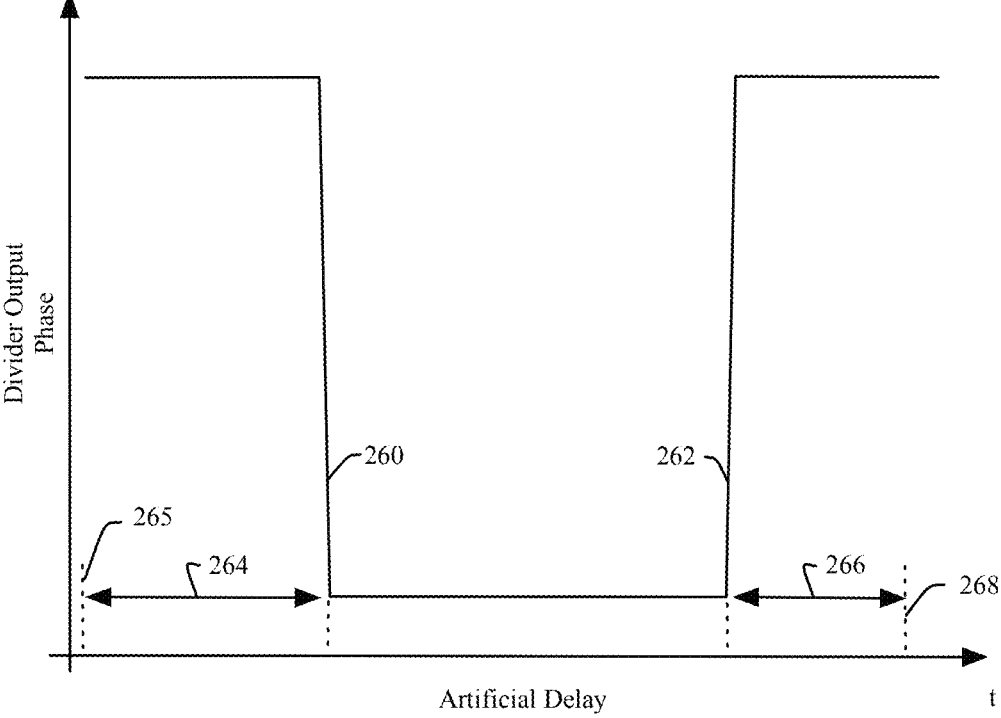
FIG. 7 is a graphical view of a timing of the SYNC circuit of FIG. 6, in accordance with an embodiment of the present disclosure.

FIG. 7 shows a graphical view of the timing of the synchronizer 44 during simulation to assess how well centered the release of the global reset 106, 108 and 116 is within the window 154 (or 164). During simulation, an artificial delay may be inserted between the TSPC latch 214 and the inverters 240 and 242 of FIG. 6. The artificial delay may be varied from zero 265 up to one full clock cycle 268 to determine when the output phase of the divider 100 or 110 changes states at 260 to determine a positive delay margin 264. A negative delay margin 266 is determined by increasing the artificial delay until a second state change occurs at 262, and then the artificial delay is subtracted by the period, since it is not practical to introduce a negative delay during simulation. This procedure may be performed for both the transmitter divider 100 and the receiver divider 110 or corner cases of process, voltage and temperature.

Figure 8:
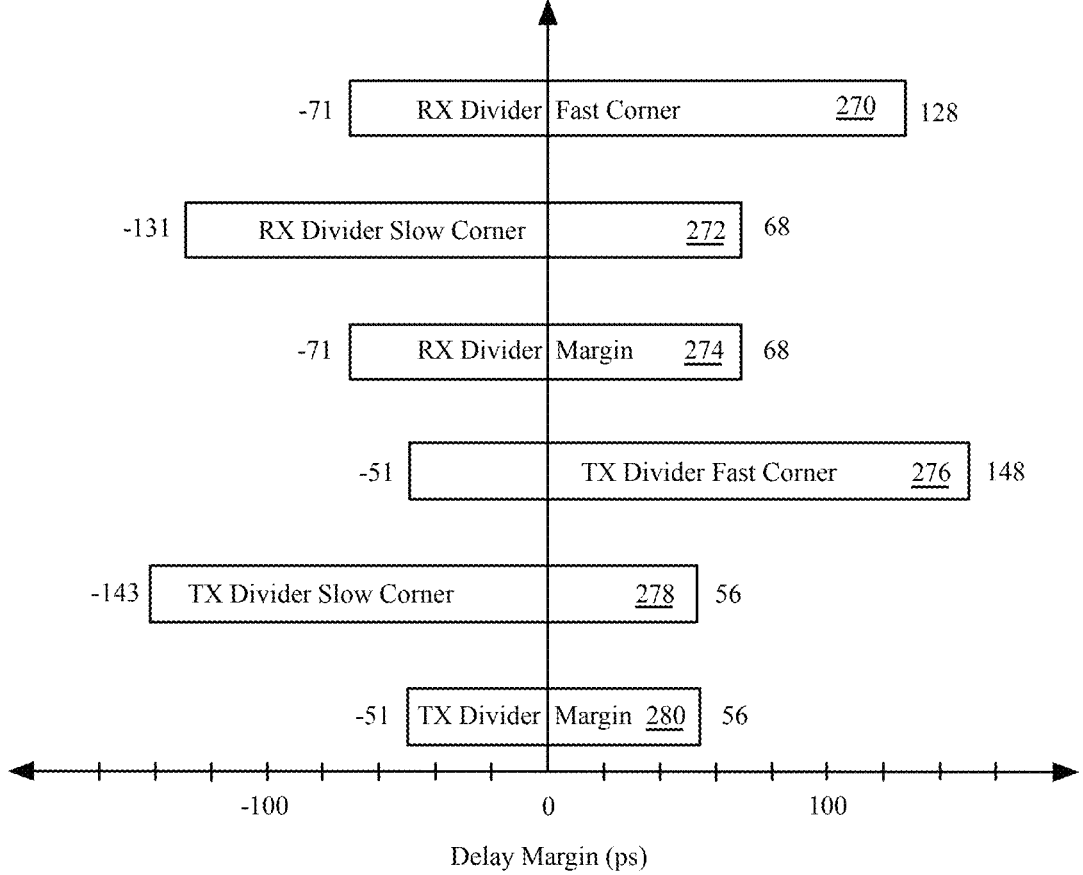
FIG. 8 is a graphical view of delay margins of the dividers of FIG. 2, in accordance with an embodiment of the present disclosure.

FIG. 8 shows a graphical view of the delay margins as determined by the method of FIG. 7. With reference to the delays shown in FIG. 3 and FIG. 6, with the method described in FIG. 7, the delay margin for the receiver divider 100 for the fast corner 270 and the slow corner 272 is shown as 274. Similarly, the delay margin for the transmitter divider 110 for the fast corner 276 and the slow corner 278 is shown as 280. In one or more embodiments, the delay margins 274 or the receiver divider 100 and the delay margins 280 for the transmitter divider 110 should be symmetric, (e.g. the positive delay margin 264 should equal the negative delay margin 266). In one or more embodiments, optimization of the delay margins may be performed by changing the characteristics of drivers and intrinsic delays of circuits within each divider 100 or 110.

Figure 9:
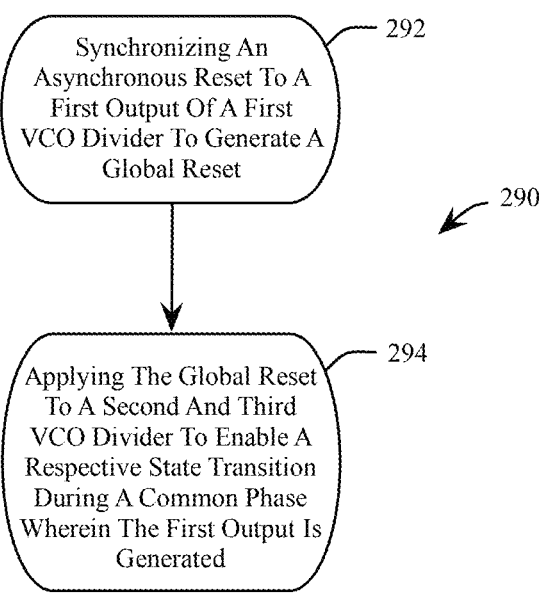
FIG. 9 is a flowchart representation of a method for self-synchronizing a system with multiple frequency dividers for enforcing phase coherency, in accordance with an embodiment of the present disclosure.

FIG. 9 shows an embodiment 290 of a method for enforcing phase coherency in a self-synchronizing system with multiple frequency dividers. With continued reference to FIG. 3 and FIG. 9, at 292 an asynchronous reset 42 is synchronized to a first output 126 of a first VCO divider 120 to generate a global reset 106, 108 and 116. At 294, the global reset 106, 108 and 116 is applied to a second 100 and a third 110 VCO divider to enable respective state transitions during a common phase wherein the first output 126 is generated.

Figure 10:
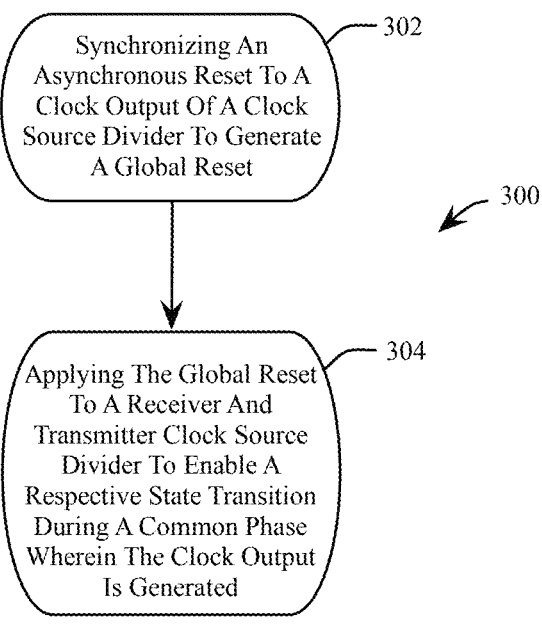
FIG. 10 is a flowchart representation of another method for self-synchronizing a system with multiple frequency dividers for enforcing phase coherency, in accordance with an embodiment of the present disclosure.

FIG. 10 shows an embodiment 300 of a method for enforcing phase coherency in a self-synchronizing system with multiple frequency dividers. With continued reference to FIG. 3 and FIG. 10, at 302 an asynchronous reset 42 is synchronized to a first output 126 of a clock source divider 120 to generate a global reset 106, 108 and 116. At 304, the global reset 106, 108 and 116 is applied to a receiver divider 100 and a transmitter divider 110 to enable respective state transitions during a common phase wherein the first output 126 is generated.

As will be appreciated, at least some of the embodiments as disclosed include at least the following. In one embodiment, a method for enforcing phase coherency in a self-synchronizing system with multiple frequency dividers comprises synchronizing an asynchronous reset to a first output of a first divider to generate a global reset, wherein the first output is generated by dividing a Voltage Controlled Oscillator (VCO) output of a VCO into a plurality of phases comprising a common phase. The global reset is applied to each of at least a second divider and a third divider to temporally align the first output during the common phase with a second output of the second divider and a third output of the third divider, wherein the second output and the third output are generated by dividing the VCO output by the respective second divider and the third divider, and applying the global reset enables a respective state transition on the second output and the third output beginning during the common phase.

Alternative embodiments of the method for enforcing phase coherency in a self-synchronizing system with multiple frequency dividers include one of the following features, or any combination thereof. The VCO is controlled with a Phase-Locked Loop (PLL) controlled by the first output. The global reset is applied to at least one additional divider to temporally align the first output during the common phase with a respective output of the at least one additional divider, wherein the at least one additional driver is configured to divide the VCO output to generate the respective output and applying the global reset enables respective state transitions on the respective output during the common phase. A timing of the global reset is adjusted to enable the respective state transitions during the common phase within a range of manufacturing processing conditions of the self-synchronizing system. A timing of the global reset is adjusted to enable the respective state transitions during the common phase within a range of operating voltage conditions of the self-synchronizing system. A timing of the global reset is adjusted to enable the respective state transitions during the common phase within a range of operating temperature conditions of the self-synchronizing system. A timing of the global reset is adjusted by modifying at least one device characteristic of at least one of the second divider and the third divider. A metastable condition of the global reset is reduced during synchronizing the asynchronous reset by regenerating the asynchronous reset with at least one regenerative latch. Applying the global reset enables respective state transitions by deactivating a respective voltage clamp on the second output and the third output.

In another embodiment, an apparatus comprises a Voltage Controlled Oscillator (VCO). A first divider is electrically coupled to the VCO and configured to generate a first output comprising a first state transition by dividing a VCO output of the VCO, the VCO output comprising a plurality of phases comprising a common phase. A synchronizer is configured to synchronize an asynchronous reset to the first output to generate a global reset. A second divider is electrically coupled to the VCO and configured to generate a second output comprising a second state transition during the common phase in response to the global reset. A third divider is electrically coupled to the VCO and configured to generate a third output comprising a third state transition during the common phase in response to the global reset.

Alternative embodiments of the apparatus include one of the following features, or any combination thereof. A regenerative circuit is connected between the asynchronous reset and the global reset to reduce a metastable condition of the global reset during synchronizing of the asynchronous reset with the first output. The regenerative circuit comprises a plurality of True Single-Phase Clock (TSPC) latches between the asynchronous reset and the global reset, and a respective pair of cross-coupled inverters between each TSPC latch, wherein the first output is configured to clock each of the TSPC latches. The second divider and the third divider comprise dissimilar device architectures. A device characteristic determines a transition time of the global reset within the common phase is different between the second divider and the third divider, to cause the global reset to transition states within a respective range of manufacturing processing conditions, operating voltage conditions and operating temperature conditions of the apparatus. The global reset is connected to a respective voltage clamp of the second divider and the third divider, wherein each respective voltage clamp is configured to enable a respective state transition on the second output and the third output beginning during the common phase.

In another embodiment, a method for enforcing phase coherency in a self-synchronizing system with multiple frequency dividers comprises synchronizing an asynchronous reset to a clock output of a clock divider to generate a global reset, wherein the clock output is generated by dividing a clock source into a plurality of phases. The global reset is applied to a receiver divider and a transmitter divider to temporally align each of a receiver output of the receiver divider and a transmitter output of the transmitter divider to the clock output during a same one of the plurality of phases, wherein the receiver output and the transmitter output are generated by dividing the clock source by the respective receiver divider and the transmitter divider, and applying the global reset enables a respective state transition on the receiver output and the transmitter output beginning during the same one of the plurality of phases.

Alternative embodiments of the method for enforcing phase coherency in a self-synchronizing system with multiple frequency dividers include one of the following features, or any combination thereof. The receiver output and the transmitter output are used for wireless location in a Bluetooth Low Energy product. A timing of the global reset is adjusted to compensate for systematic design offsets between the transmitter divider and the receiver divider. A timing of the global reset is adjusted to compensate for environmental differences between the transmitter divider and the receiver divider. A timing of the global reset is adjusted to enable the respective state transitions during the common phase within a respective range of manufacturing processing conditions, operating voltage conditions and operating temperature conditions of the self-synchronizing system.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for enforcing phase coherency in a self-synchronizing system with multiple frequency dividers comprising:

synchronizing an asynchronous reset to a first output of a first divider to generate a global reset, wherein the first output is generated by dividing a Voltage Controlled Oscillator (VCO) output of a VCO into a plurality of phases comprising a common phase;

applying the global reset to each of at least a second divider and a third divider to temporally align the first output during the common phase with a second output of the second divider and a third output of the third divider, wherein the second output and the third output are generated by dividing the VCO output by the respective second divider and the third divider, and applying the global reset enables a respective state transition on the second output and the third output beginning during the common phase; and reducing a metastable condition of the global reset during synchronizing the asynchronous reset by regenerating the asynchronous reset with at least one regenerative latch.

2. The method of claim 1 further comprising controlling the VCO with a Phase-Locked Loop (PLL) controlled by the first output.

3. The method of claim 1 further comprising applying the global reset to at least one additional divider to temporally align the first output during the common phase with a respective output of the at least one additional divider, wherein the at least one additional driver is configured to divide the VCO output to generate the respective output and applying the global reset enables respective state transitions on the respective output during the common phase.

4. The method of claim 1 further comprising adjusting a timing of the global reset to enable the respective state transitions during the common phase within a range of manufacturing processing conditions of the self-synchronizing system.

5. The method of claim 1 further comprising adjusting a timing of the global reset to enable the respective state transitions during the common phase within a range of operating voltage conditions of the self-synchronizing system.

6. The method of claim 1 further comprising adjusting a timing of the global reset to enable the respective state transitions during the common phase within a range of operating temperature conditions of the self-synchronizing system.

7. The method of claim 1 wherein a timing of the global reset is adjusted by modifying at least one device characteristic of at least one of the second divider and the third divider.

8. A method for enforcing phase coherency in a self-synchronizing system with multiple frequency dividers comprising:

synchronizing an asynchronous reset to a first output of a first divider to generate a global reset, wherein the first output is generated by dividing a Voltage Controlled Oscillator (VCO) output of a VCO into a plurality of phases comprising a common phase; and applying the global reset to each of at least a second divider and a third divider to temporally align the first output during the common phase with a second output of the second divider and a third output of the third divider, wherein the second output and the third output are generated by dividing the VCO output by the respective second divider and the third divider, and applying the global reset enables a respective state transition on the second output and the third output beginning during the common phase, wherein applying the global reset enables respective state transitions by deactivating a respective voltage clamp on the second output and the third output.

9. The method of claim 8 further comprising controlling the VCO with a Phase-Locked Loop (PLL) controlled by the first output.

10. The method of claim 8 further comprising applying the global reset to at least one additional divider to temporally align the first output during the common phase with a respective output of the at least one additional divider, wherein the at least one additional driver is configured to divide the VCO output to generate the respective output and applying the global reset enables respective state transitions on the respective output during the common phase.

11. The method of claim 8 further comprising adjusting a timing of the global reset to enable the respective state transitions during the common phase within a range of manufacturing processing conditions of the self-synchronizing system.

12. The method of claim 8 further comprising adjusting a timing of the global reset to enable the respective state transitions during the common phase within a range of operating voltage conditions of the self-synchronizing system.

13. The method of claim 8 further comprising adjusting a timing of the global reset to enable the respective state transitions during the common phase within a range of operating temperature conditions of the self-synchronizing system.

14. The method of claim 8 wherein a timing of the global reset is adjusted by modifying at least one device characteristic of at least one of the second divider and the third divider.

15. An apparatus comprising:
a Voltage Controlled Oscillator (VCO);
a first divider electrically coupled to the VCO and configured to generate a first output comprising a first state transition by dividing a VCO output of the VCO, the VCO output comprising a plurality of phases comprising a common phase;
a synchronizer configured to synchronize an asynchronous reset to the first output to generate a global reset, a second divider electrically coupled to the VCO and configured to generate a second output comprising a second state transition during the common phase in response to the global reset;
a third divider electrically coupled to the VCO and configured to generate a third output comprising a third state transition during the common phase in response to the global reset; and
a regenerative circuit connected between the asynchronous reset and the global reset to reduce a metastable condition of the global reset during synchronizing of the asynchronous reset with the first output.

16. The apparatus of claim 15 wherein the regenerative circuit comprises a plurality of True Single-Phase Clock (TSPC) latches between the asynchronous reset and the global reset, and a respective pair of cross-coupled inverters between each TSPC latch, wherein the first output is configured to clock each of the TSPC latches.

17. The apparatus of claim 15 wherein the second divider and the third divider comprise dissimilar device architectures.

18. The apparatus of claim 15 wherein a device characteristic determining a transition time of the global reset within the common phase is different between the second divider and the third divider, to cause the global reset to transition states within a respective range of manufacturing processing conditions, operating voltage conditions and operating temperature conditions of the apparatus.

19. An apparatus comprising:
a Voltage Controlled Oscillator (VCO);
a first divider electrically coupled to the VCO and configured to generate a first output comprising a first state transition by dividing a VCO output of the VCO, the VCO output comprising a plurality of phases comprising a common phase;
a synchronizer configured to synchronize an asynchronous reset to the first output to generate a global reset, a second divider electrically coupled to the VCO and configured to generate a second output comprising a second state transition during the common phase in response to the global reset; and
a third divider electrically coupled to the VCO and configured to generate a third output comprising a third state transition during the common phase in response to the global reset
wherein the global reset is connected to a respective voltage clamp of the second divider and the third divider, wherein each respective voltage clamp is configured to enable a respective state transition on the second output and the third output beginning during the common phase.

20. The apparatus of claim 19 wherein the second divider and the third divider comprise dissimilar device architectures.

21. The apparatus of claim 19 wherein a device characteristic determining a transition time of the global reset within the common phase is different between the second divider and the third divider, to cause the global reset to transition states within a respective range of manufacturing processing conditions, operating voltage conditions and operating temperature conditions of the apparatus.

* * * * *